(12) United States Patent
Lee et al.

(10) Patent No.: US 10,637,428 B2
(45) Date of Patent: Apr. 28, 2020

(54) ACOUSTIC WAVE DEVICE AND METHOD OF MANUFACTURING THE SAME

(71) Applicant: SAMSUNG ELECTRO-MECHANICS CO., LTD., Suwon-si (KR)

(72) Inventors: Yeong Gyu Lee, Suwon-si (KR); Jeong Suong Yang, Suwon-si (KR); Hyung Goo Baek, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 79 days.

(21) Appl. No.: 15/791,523

(22) Filed: Oct. 24, 2017

(65) Prior Publication Data

US 2018/0337651 A1 Nov. 22, 2018

(30) Foreign Application Priority Data

May 22, 2017 (KR) ........................ 10-2017-0063105

(51) Int. Cl.
*H03H 9/05* (2006.01)
*H03H 9/10* (2006.01)
(Continued)

(52) U.S. Cl.
CPC .............. *H03H 3/08* (2013.01); *H03H 3/02* (2013.01); *H03H 9/059* (2013.01); *H03H 9/10* (2013.01);
(Continued)

(58) Field of Classification Search
CPC .. H03H 9/64; H03H 9/70; H03H 9/05; H03H 9/058; H03H 9/10; H03H 3/02
(Continued)

(56) References Cited

U.S. PATENT DOCUMENTS 7,427,824 B2 * 9/2008 Iwamoto .............. H03H 9/0576
310/313 R
7,583,161 B2 * 9/2009 Tanaka ................. H03H 9/0576
333/133
(Continued)

FOREIGN PATENT DOCUMENTS

JP 2007-19943 A 1/2007
JP 2007-104264 A 4/2007
WO WO-2016068096 A1 * 5/2016 ............... H03H 9/25

OTHER PUBLICATIONS

Lee, Jong G. et al. "Defect-sealing of Al2O3/ZrO2 multilayer for barrier coating by plasma-enhanced atomic layer deposition process", Department of Chemical Engineering, Thin Solid Films, Kyung Hee University,577, 2015 (pp. 143-148).

*Primary Examiner* — Dean O Takaoka
(74) *Attorney, Agent, or Firm* — NSIP Law

(57) ABSTRACT

An acoustic wave device includes an acoustic wave generator formed on one surface of a substrate; a support member formed on the one surface of the substrate spaced apart from the acoustic wave generator; a protective member coupled to the support member and disposed to be spaced apart from the acoustic wave generator; and a sealing part encapsulating the protective member and the support member, wherein the sealing part includes one, or a plurality of, first hermetic layer(s) and one, or a plurality of, second hermetic layer(s), and the first hermetic layer(s) and the second hermetic layer(s) are alternately stacked.

14 Claims, 6 Drawing Sheets

(51) Int. Cl.
*H03H 9/64* (2006.01)
*H03H 3/08* (2006.01)
*H03H 3/02* (2006.01)

(52) U.S. Cl.
CPC ........ *H03H 9/1014* (2013.01); *H03H 9/1071* (2013.01)

(58) Field of Classification Search
USPC .......................................... 333/133, 193–196
See application file for complete search history.

(56) References Cited

U.S. PATENT DOCUMENTS

| | | | |
|---|---|---|---|
| 7,972,884 B2 | 7/2011 | Obata et al. | |
| 7,999,632 B2* | 8/2011 | Iwamoto | H03H 3/08 333/133 |
| 8,004,160 B2* | 8/2011 | Tsuda | H03H 9/059 310/313 R |
| 8,461,940 B2* | 6/2013 | Takada | H03H 9/0523 333/186 |
| 8,736,149 B2* | 5/2014 | Inoue | H01L 23/315 310/313 R |
| 8,910,355 B2* | 12/2014 | Adkisson | H03H 9/173 29/25.35 |
| 9,083,313 B2* | 7/2015 | Takemura | H01P 1/213 |
| 10,236,859 B2* | 3/2019 | Kido | H03H 9/25 |
| 2007/0075606 A1 | 4/2007 | Inoue et al. | |
| 2010/0045145 A1* | 2/2010 | Tsuda | H03H 3/08 310/365 |
| 2012/0280768 A1* | 11/2012 | Nakayama | H03H 9/0057 333/193 |
| 2014/0131853 A1* | 5/2014 | Takemura | H03H 9/0542 257/734 |

* cited by examiner

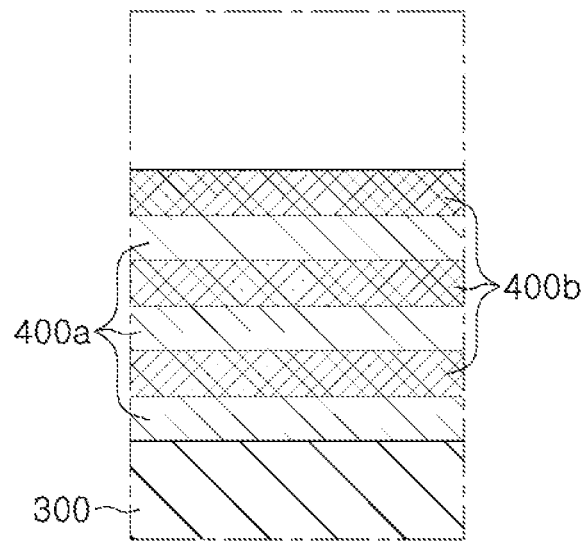
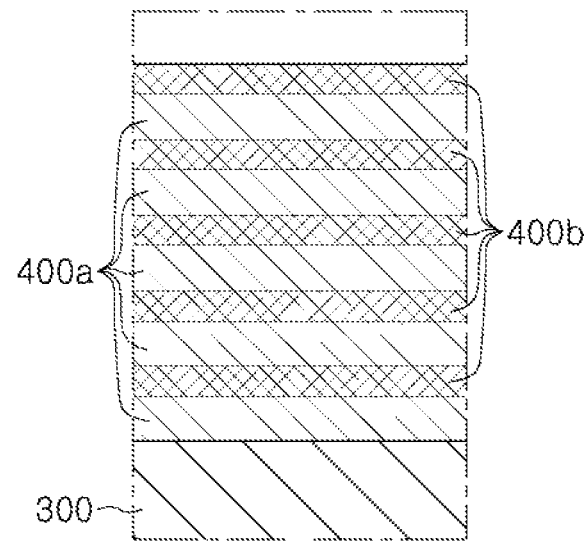
FIG. 4A     FIG. 4B
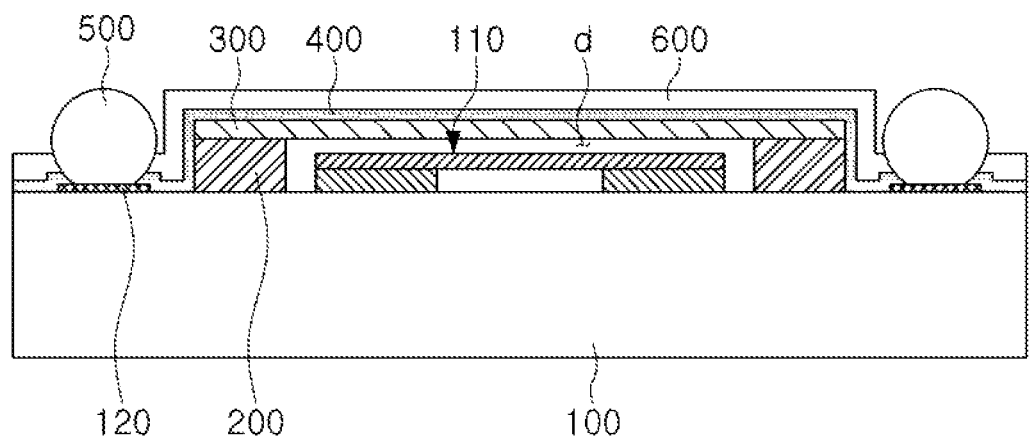
FIG. 5

ACOUSTIC WAVE DEVICE AND METHOD OF MANUFACTURING THE SAME

CROSS-REFERENCE TO RELATED APPLICATIONS

This application claims the benefit under 35 USC 119(a) of Korean Patent Application No. 10-2017-0063105 filed on May 22, 2017, in the Korean Intellectual Property Office, the disclosure of which is incorporated herein by reference in its entirety.

BACKGROUND

1. Field

This Description relates to an acoustic wave device and a method of manufacturing the same.

2. Description of Related Art

A band pass filter is a component in a communications device that selects a signal, within a necessary frequency band, from among various frequency bands, to transmit and receive the selected signal.

Representative examples of band pass filters include a surface acoustic wave (SAW) filter, a bulk acoustic wave (BAW) filter, and the like.

An acoustic wave device requires space between an acoustic wave generator and a cap member for operational characteristics thereof, and is thus manufactured so that a gap is formed between the acoustic wave generator and the cap member.

Acoustic wave devices may have serious performance problems when moisture permeates into an internal space of the cap member. Therefore, it is very important to entirely seal the internal space of the cap member to maintain hermeticity from the surrounding environment.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An aspect of this description provides an acoustic wave device and a method of manufacturing the same with improved hermeticity.

One aspect of this description provides an acoustic wave device including an acoustic wave generator disposed on a substrate; a support member disposed on the substrate spaced apart from the acoustic wave generator, a protective member coupled to the support member and disposed spaced apart from the acoustic wave generator, and a sealing part encapsulating the protective member and the support member. The sealing part includes one, or a plurality of, first hermetic layer(s) and one, or a plurality of, second hermetic layer(s), and the first hermetic layer(s) and the second hermetic layer(s) are alternately stacked.

The acoustic wave device may include a first hermetic layer and a second hermetic layer with a thickness of about 4 nm to about 46 nm. The acoustic wave device may include a first hermetic layer and a second hermetic layer each including inorganic films of different materials. For example, the acoustic wave device may include a hermetic layer including $Al_2O_3$, and a second hermetic layer including $ZrO_2$. The acoustic wave device may include a first hermetic layer and a second hermetic layer with approximately the same thickness.

The acoustic wave device may include a sealing part with a thickness of about 30 nm to about 50 nm. The acoustic wave device may have a sealing part disposed along a surface formed by the protective member, the support member, and the substrate. The acoustic wave device may include a protective layer disposed on a surface of the sealing part. The acoustic wave device may include a protective layer that comprises an organic film. The acoustic wave device may include a metal member disposed on a surface of the protective member.

The acoustic wave device may include a piezoelectric thin film resonator in which a lower electrode, a piezoelectric layer, and an upper electrode are sequentially stacked.

A method of manufacturing an acoustic wave device includes providing a substrate, forming an acoustic wave generator on one surface of the substrate, forming a support member on the one surface of the substrate generally along the circumference of the acoustic wave generator, disposing a protective member on the support member spaced apart from the acoustic wave generator, and forming a sealing part to substantially encapsulate the protective member and the support member. The sealing part is formed by alternately stacking one, or a plurality of, first hermetic layer(s) and one, or a plurality of, second hermetic layer(s).

The method may include the first hermetic layer and the second hermetic layer being formed by atomic layer deposition (ALD). The method may include, after forming the sealing part, forming an organic film on a surface of the sealing part. The method may include disposing a metal member on a surface of the protective member.

Other features and aspects will be apparent from the following detailed description, the drawings, and the claims.

BRIEF DESCRIPTION OF DRAWINGS

FIGS. 4A and 4B are enlarged cross-sectional views of part B of FIG. 3;

FIG. 5 is a cross-sectional view schematically illustrating an acoustic wave device according to an embodiment;

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Figure 1:
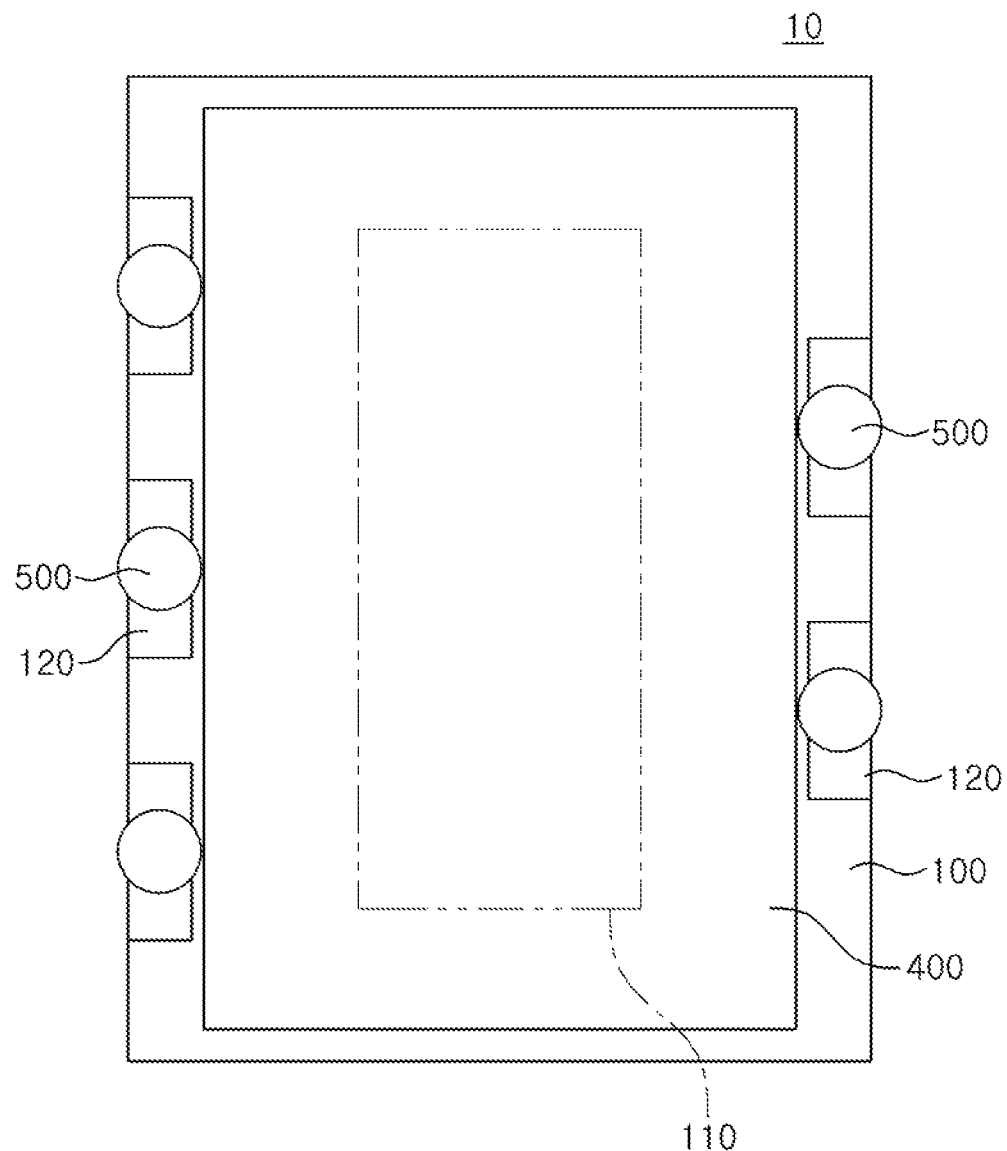
FIG. 1 is a schematic plan view of an acoustic wave device according to an embodiment.
Figure 2:
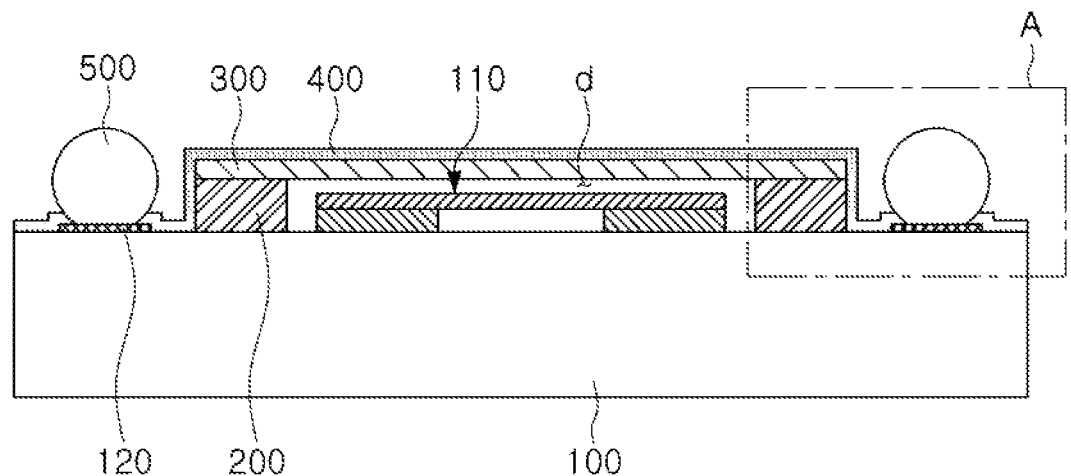
FIG. 2 is a schematic cross-sectional view of the acoustic wave device according to an embodiment.
Figure 3:
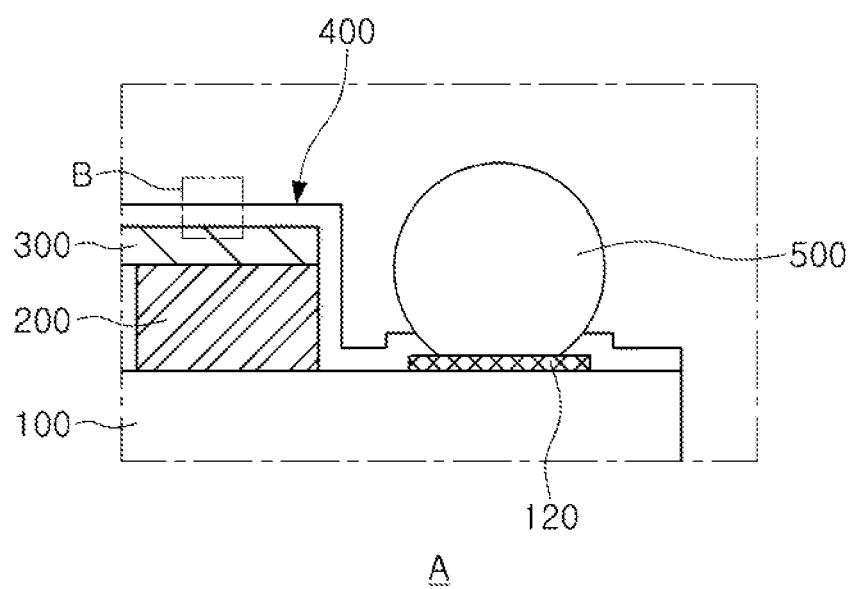
FIG. 3 is an enlarged cross-sectional view of part A of FIG. 2.

FIG. 1 is a schematic plan view of an acoustic wave device according to an embodiment and FIG. 2 is a schematic cross-sectional view of an acoustic wave device according to an embodiment. In addition, FIG. 3 is an enlarged cross-sectional view of part A of FIG. 2; and FIGS. 4A and 4B are enlarged cross-sectional views of part B of FIG. 3.

Referring to FIGS. 1 through 4B, an acoustic wave device 10 according to an embodiment includes a substrate 100, a support member 200, a protective member 300, and a sealing part 400. Here, the acoustic wave device 10 is generally a device including a filter element such as a surface acoustic wave (SAW) filter, a bulk acoustic wave (BAW) filter, a duplexer, and the like, transmitting frequency bands.

As the substrate 100, a piezoelectric substrate may be provided in an embodiment of the SAW filter, and a Si substrate may be used in an embodiment of the BAW filter.

For example, the substrate 100 may be formed of single crystal such as $LiTaO_3$, $LiNbO_3$, $Li_2B_4O_7$, $SiO_2$, or silicon. Together with the materials described above, lead zirconium titanate (PZT) based polycrystal or a zinc oxide (ZnO) thin film may be used.

However, the substrate used for the acoustic wave device 10 is not limited to the above-mentioned examples, but may be substituted with various substrates which are known in the art.

An acoustic wave generator 110 may be provided to one surface of the substrate 100.

In an embodiment in which the acoustic wave device 10 is the surface acoustic wave (SAW) filter, the acoustic wave generator 110 may be provided in the form of a metal electrode. The acoustic wave generator 110 may be formed of aluminum or copper, and may include an interdigital transducer (IDT) electrode in which a plurality of electrodes alternately intersect with each other in a comb form.

In an embodiment, the acoustic wave generator 110 may be provided by forming a metal layer on the substrate 100 and machining the metal layer into an electrode form by a method including photolithography.

Meanwhile, in an embodiment in which the acoustic wave device 10 is the bulk acoustic wave (BAW) filter, the acoustic wave generator 110 may be provided by forming a separate structure. For example, the acoustic wave generator 110 may be provided with a piezoelectric thin film resonator that converts an electrical signal into a mechanical signal or converts a mechanical signal into an electrical signal.

In this embodiment, the acoustic wave generator 110 forms a resonating part by sequentially stacking a lower electrode, a piezoelectric layer, and an upper electrode.

A support member 200 may be disposed spaced apart from the acoustic wave generator 110 on one surface of the substrate 100.

The support member 200 may be continuously disposed spaced apart from the acoustic wave generator 110 and to generally surround the circumference of the acoustic wave generator 110.

The support member 200 may be formed to be thicker than the acoustic wave generator part 110. Accordingly, a protective member 300 seated on the support member 200 is not necessarily in contact with the acoustic wave generator 110, and a gap may be formed between the protective member 300 and the acoustic wave generator 110.

Meanwhile, the structure of the support member 200 according to an embodiment is not limited to the above-mentioned configuration, and may take various forms wherein a gap is formed between the protective member 300 and the acoustic wave generator 110. The gap may be sufficient to prevent contact between the acoustic wave generator 110 and the protective member 300 when in operation.

The support member 200 may be formed of an insulating material such as a resin or a polymer. However, the material of the support member 200 is not limited thereto, and in an embodiment in which the support member 200 is disposed to be sufficiently spaced apart from the acoustic wave generator 110 or insulation between the support member 200 and the acoustic wave generator 110 is provided, the support member 200 may also be formed of a metal.

The protective member 300 may be disposed on the support member 200. The support member 200 and the protective member 300 may protect the acoustic wave generator 110 from the external environment. In addition, in an embodiment in which the acoustic wave generator 110 is a bulk acoustic wave (BAW) filter, the support member 200 may space the acoustic wave generator 110 and the protective member 300 apart from each other so that the acoustic wave generator 110 is not in contact with the protective member 300 when the acoustic wave generator 110 resonates and is deformed.

Therefore, a space d may be formed between the acoustic wave generator part 110 and the protective part 300 by the support member 200, and such a space d may provide space for the acoustic wave generator 110 to be deformed when the acoustic wave device 10 is driven.

The protective member 300 may be formed to substantially entirely cover an upper portion of the acoustic wave generator 110.

The protective member 300 according to an embodiment may be in the form of a flat plate. As the protective member 300, a plate formed of a resin or polymeric material having some rigidity may be used, and a plate (e.g., a copper plate) formed of a metal may also be used. For example, as the protective member 300, a dry film photoresist (DFR) may be used.

The protective member 300 may have a lower surface which is in contact with a least a portion of an upper surface of the support member 200 and may be seated on the support member 200.

The protective member 300 may be separately made and may be bonded onto the support member 200. However, the protective member 300 is not limited thereto.

The outer surfaces of the protective member 300 and the support member 200 may be sealed by a sealing part 400.

The sealing part 400 may be disposed along a surface formed by the protective member 300, the support member 200, and one surface of the substrate to prevent permeation of moisture and foreign matter into the space d formed by the protective member 300 and the support member 200 by sealing the outer surfaces of the protective member 300 and the support member 200.

The sealing part 400 may be formed of an inorganic film having a plurality of layers. Here, the inorganic film may include one, or more than one, of an oxide film, a nitride film, a sulfide film, a fluoride film, or a carbonized film.

Further, the sealing part 400 may include one, or more than one, first hermetic layer 400a and one, or more than one, second hermetic layer 400b. The first hermetic layer 400a may be formed on a surface formed by the protective member 300, the support member 200, and one surface of the substrate 100, and the second hermetic layer 400b; the second hermetic layer 400b may be formed on the first hermetic layer 400a.

The first hermetic layer 400a and the second hermetic layer 400b may be formed of inorganic films of different materials. According to an embodiment, the first hermetic layer 400a may be formed of an $Al_2O_3$ layer, and the second hermetic layer 400b may be formed of a $ZrO_2$ layer. However, the first hermetic layer 400a and the second hermetic layer 400b are not limited thereto.

Further, the first hermetic layer 400a and the second hermetic layer 400b may be alternately stacked. In an embodiment, the second hermetic layer 400b may be interposed between two first hermetic layers 400a, and the first hermetic layer 400a may be interposed between two second hermetic layers 400b.

In addition, the sealing part 400 may have a total thickness in a range of about 30 nm to about 50 nm, and the first hermetic layer 400a and the second hermetic layer 400b may be formed by alternately each stacking three layers (six layers in total) to five layers (tens layers in total).

FIGS. 4A and 4B are enlarged cross-sectional views of the sealing part 400 according to an embodiment, where FIG. 4A illustrates an example in which the first hermetic layer 400a and the second hermetic layer 400b have approximately the same thickness and FIG. 4B illustrates an example in which the first hermetic layer 400a and the second hermetic layer 400b have different thicknesses.

Referring to FIG. 4A, the first hermetic layer 400a and the second hermetic layer 400b may have approximately the same thickness. According to an embodiment, the thickness of the first hermetic layer 400a and the second hermetic layer 400b may be approximately 4 nm or more.

In an embodiment in which the thickness of the hermetic layer is less than about 4 nm, flexibility of the sealing part 400 may be reduced. Therefore, the first and second hermetic layers 400a and 400b according to this embodiment may all have the thickness of about 5 nm or more.

In an embodiment in which the first hermetic layer 400a and the second hermetic layer 400b all have a thickness of about 5 nm and the first hermetic layer 400a and the second hermetic layer 400b are each stacked in a three layers embodiment, a total thickness of the sealing part 400 may be about 30 nm.

In addition, as described above, since a maximum thickness of the sealing part 400 is approximately 50 nm in the present exemplary embodiment, the maximum thickness of the first hermetic layer 400a and the second hermetic layer 400b may be in a range of about 50 nm or less according to a combination of a total number of layers and the thickness of the hermetic layers 400a and 400b.

Meanwhile, referring to FIG. 4B, the first hermetic layer 400a may have a thickness thicker than that of the second hermetic layer 400b. According to an embodiment, the thickness of the first hermetic layer 400a may be about 6 nm and the thickness of the second hermetic layer 400b may be about 4 nm.

Therefore, in the example in which the first hermetic layer 400a and the second hermetic layer 400b are each stacked in a five layers embodiment, the total thickness of the sealing part 400 may be approximately 50 nm.

As such, the sealing part 400 according to an embodiment may form the first hermetic layers 400a and the second hermetic layers 400b having various thicknesses and various numbers of layers in the range of thickness of about 30 nm to about 50 nm. In addition, the hermetic layers 400a and 400b may be deformed in a variety of ways. For example, the first hermetic layers 400a may have thicknesses different from each other or the second hermetic layers 400b may have thicknesses different from each other.

Meanwhile, as described above, the maximum thickness of the sealing part 400 according to an embodiment may be about 50 nm. In addition, a minimum thickness of the hermetic layers 400a and 400b may be about 4 nm. In addition, since the sealing part 400 according to this embodiment should have one or more first hermetic layer 400a and one or more second hermetic layer 400b, the maximum thickness of the hermetic layers 400a and 400b may be about 46 nm.

Such a sealing part 400 may be formed by repeatedly depositing the first hermetic layer 400a and the second hermetic layer 400b by a method involving atomic layer deposition (ALD).

A connection terminal 500 which is electrically connected to the acoustic wave generator 110 may be disposed on one surface of the substrate 100. The connection terminal 500 may be formed outside the sealing part 400 and may be bonded to the substrate 100 through an electrode pad 120.

The connection terminal 500 may be formed as a solder ball or a solder bump, but is not limited thereto.

Such a connection terminal 500 may be provided to electrically connect a package substrate 2 (FIG. 9) and an acoustic wave device 10 with each other. For example, an acoustic wave device 10 may be mounted on the package substrate 2 by soldering the connection terminal 500 and the package substrate 2.

Meanwhile, although not illustrated, a wiring pattern (not shown) for electrically connecting the electrode pad 120 and the acoustic wave generator 110 with each other may be formed on one surface of the substrate 100. In addition, the sealing part 400 may also be disposed on one surface of the substrate 100 which is positioned outside the support member 200.

The acoustic wave device according to an embodiment configured as described above may form a sealing part 400 by alternately stacking two hermetic layers 400a and 400b formed of different materials. Therefore, when compared with a sealing part formed of one material, hermetic reliability of the space d in which the acoustic wave generator 110 is disposed is obtained, and as a result, an element having high reliability is provided.

In addition, since the sealing part 400 has a maximum thickness of about 50 nm or less, the total thickness of the acoustic wave device may not be increased, compared to related art, even if the sealing part is formed by stacking a plurality of hermetic layers. Therefore, the size of the acoustic wave device may be maintained similar to the related art, with hermeticity increased.

FIG. 5 is a cross-sectional view schematically illustrating an acoustic wave device according to an embodiment.

Referring to FIG. 5, an acoustic wave device according to an embodiment may include the substrate 100 having an acoustic wave generator 110 formed on one surface thereof, a support member 200 formed on one surface of the substrate 100 to be spaced apart from the acoustic wave generator 110, a protective member 300 coupled to support member 200 and formed to be spaced apart from the acoustic wave generator 110, the sealing part 400 sealing outer surfaces of the protective member 300 and the support member 200, and the connection terminal 500 formed on one surface of the substrate 100. The distance that the protective member 300 is spaced apart from the acoustic wave generator 110 may provide an amount of space for deformation of the acoustic wave generator 110 while in operation without encountering, or contacting, the protective member 300.

In addition to this, a protective layer 600 may be disposed along a surface of the sealing part 400. In this example, since the protective layer 600 additionally seals the sealing part 400, hermetic reliability is further increased.

The protective layer 600 may be formed of an organic film. For example, the protective layer 600 may be formed of a film of a resin or polymeric material. However, the protective layer 600 is not limited thereto.

Figure 6:
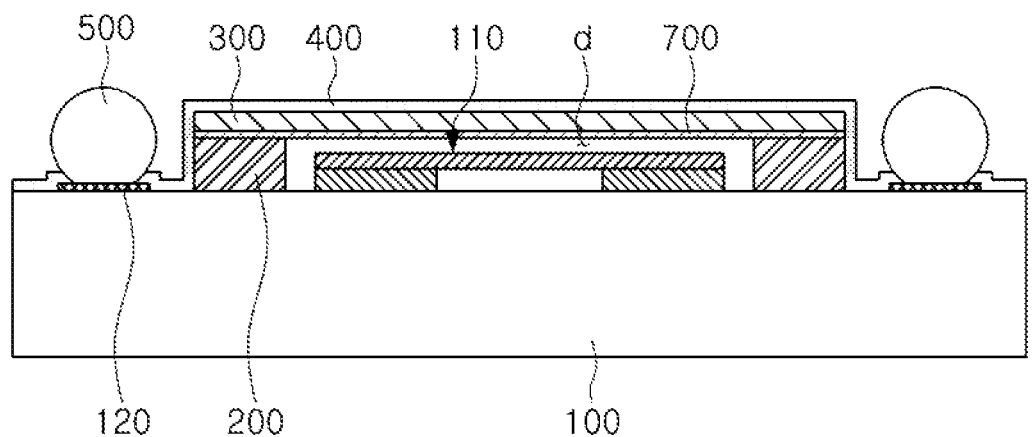
FIG. 6 is a cross-sectional view schematically illustrating an acoustic wave device according to an embodiment.

FIG. 6 is a cross-sectional view schematically illustrating an acoustic wave device according to an embodiment.

Referring to FIG. 6, an acoustic wave device according to an embodiment may have a metal member 700 disposed between protective member 300 and the support member 200.

The metal member 700 may be formed in a flat plate form, which may be similar to the protective member 300, to be disposed on a lower surface of the protective member 300, and may be formed of a metal (e.g., copper plate) to provide rigidity.

Such a metal member 700 may be provided to significantly reduce deformation of the protective member 300 when injection molding is performed to package the acoustic wave device 10.

The acoustic wave device 10 may be generally mounted on a package substrate 2 (FIG. 2), and in order to protect and encapsulate the acoustic wave device 10, an encapsulating part 3 for embedding the acoustic wave device 10 may be formed by injection molding. In this case, a resin material such as an epoxy, or the like, may be injected and press the sealing part 400 or the protective member 300 of the acoustic wave device 10. If protective member 300 is deformed by injection pressure, a problem in that the protective member 300 comes into contact with the acoustic wave generator 110, or the like may occur.

However, the acoustic wave device 10 according to an embodiment may have a separate metal member 700 disposed between the protective member 300 and the acoustic wave generator 110. Since the metal member 700 supplements rigidity of the protective member 300, a phenomenon wherein protective member 300 is inwardly bent and deformed by an external force may be significantly reduced, thereby suppressing occurrence of the above-mentioned problem.

Figure 7:
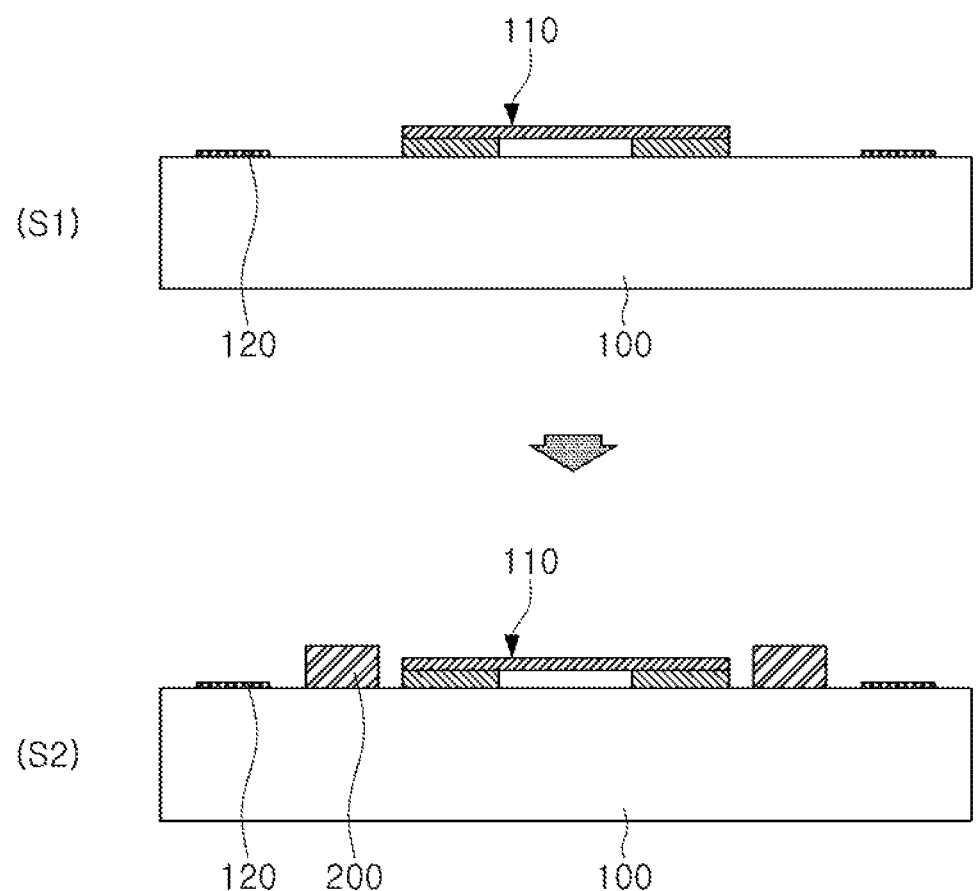
FIGS. 7 and 8 are views illustrating a method of manufacturing the acoustic wave device illustrated in FIG. 2.
Figure 8:
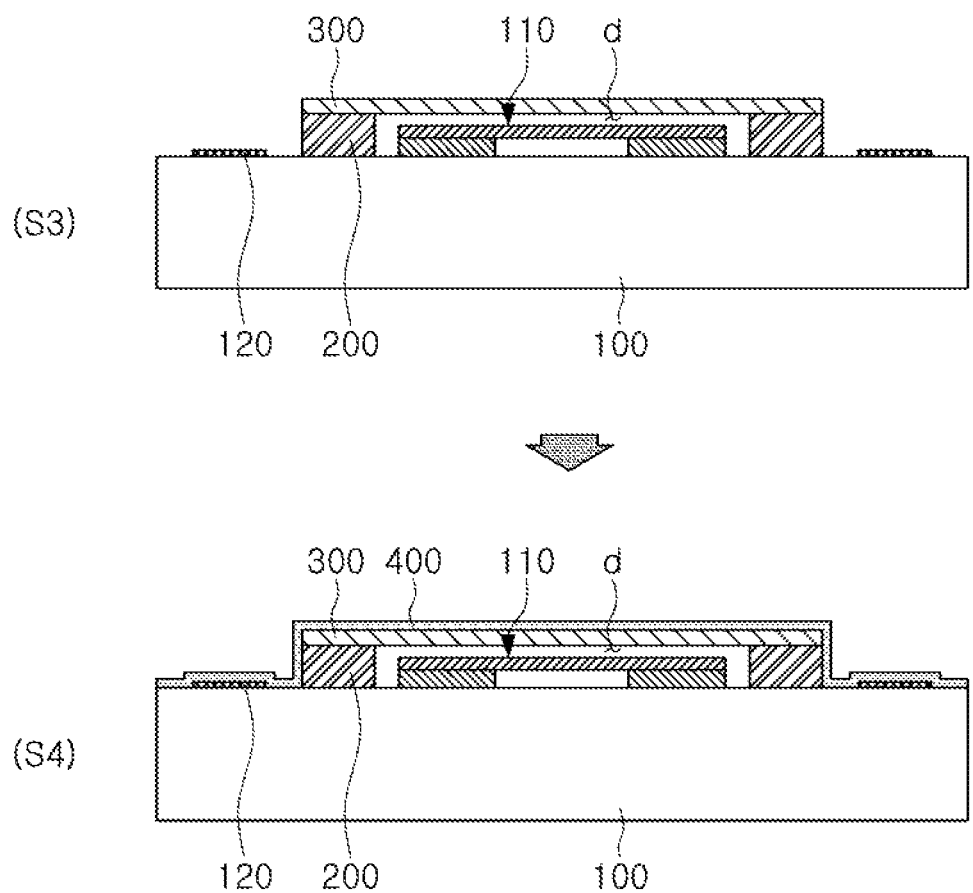

FIGS. 7 and 8 are views illustrating a method of manufacturing the acoustic wave device illustrated in FIG. 2. A method of manufacturing an acoustic wave device will be described below with reference to FIGS. 7 and 8.

In the a method of manufacturing an acoustic wave device according to an embodiment, an operation (S1) of forming the acoustic wave generator 110 on the substrate 100 used for the acoustic wave device may be first performed.

As described above, in the case of an SAW filter, the substrate 100 may be provided as a piezoelectric substrate, and in the case of a BAW filter, a Si substrate may be used.

However, the substrate 100 used for the acoustic wave device is not limited to the above-mentioned example, but may be substituted with various substrates which are used in the art.

In an embodiment in which the acoustic wave device 10 is used as the BAW filter, the acoustic wave generator 110 may be formed on one surface of the substrate 100 as a separate structure in which a lower electrode, a piezoelectric layer, and an upper electrode are sequentially stacked.

Meanwhile, in an embodiment in which the acoustic wave device 10 is used as an SAW filter, the acoustic wave generator 110 may be formed of aluminum or copper, and may be formed in a structure in which a plurality of electrodes intersect with each other in a comb form. In this case, the acoustic wave generator 110 may be provided by forming a conducting layer on the substrate 100 and machining the conducting layer into electrode form by photolithography.

In this example, the electrode pad 120, which is electrically connected to the acoustic wave generator 110, may be formed generally around the acoustic wave generator 110. The electrode pad 120 may be formed together with the acoustic wave generator 110, or may be formed after forming the acoustic wave generator 110.

After the acoustic wave generator 110 is formed on substrate 100, an operation (S2) of forming the support member 200 generally along the circumference of the acoustic wave generator 110 on one surface of the substrate 100 may be performed.

The support member 200 may be formed of an insulating organic material such as a resin or a polymer. However, support member 200 may also be formed of metal, as needed.

The support member 200 may be formed by a method including photolithography. However, the support member 200 is not limited thereto.

Next, an operation (S3) of disposing the protective member 300 on the support member 200 may be performed. In this case, the protective member 300 may be spaced apart from the acoustic wave generator 110 and may be seated on the support member 200.

Protective member 300 may be disposed to substantially entirely cover an upper portion of the acoustic wave generator 110. Therefore, acoustic wave generator 110 may be disposed in space d formed by protective member 300 and support member 200.

Protective member 300 may be separately made and may be transferred onto the support member 200. In addition, the protective member 300 may also be formed by forming an organic film or a conductor film on the support member and removing any unnecessary portion.

Next, an operation (S4) of forming the sealing part 400 that encapsulates the protective member 300 and the support member 200 may be performed.

Sealing part 400 may be formed on substantially the entirety of the surface formed by the protective member 300, the support member 200, and one surface of the substrate 100.

The sealing part 400 may be formed by repeatedly performing an operation of forming a first hermetic layer 400a (FIG. 4) and an operation of forming a second hermetic layer 400b (FIG. 4) on the first hermetic layer 400a.

Here, the first hermetic layer 400a and the second hermetic layer 400b may be all formed by atomic layer deposition (ALD). In an embodiment in which the ALD method is used, the inorganic film may have a thickness of about 5 nm. Therefore, even in an embodiment in which the hermetic layers 400a and 400b having a plurality of layers are formed, since the sealing part 400 may have a total thickness of about 50 nm or less, the sealing part 400 is not excessively thick.

As described above, the sealing part 400 may be formed by repeatedly stacking an $Al_2O_3$ layer and a $ZrO_2$ layer.

Next, after the electrode pad 120 is exposed to the outside by removing a portion of the sealing part 400, the acoustic wave device 10 illustrated in FIG. 2 may be completed by forming the connection terminal 500 on the exposed electrode pad 120.

Meanwhile, the method of manufacturing the acoustic wave device according to an embodiment is not limited to the embodiments described above, and may be modified in various ways.

Figure 9:
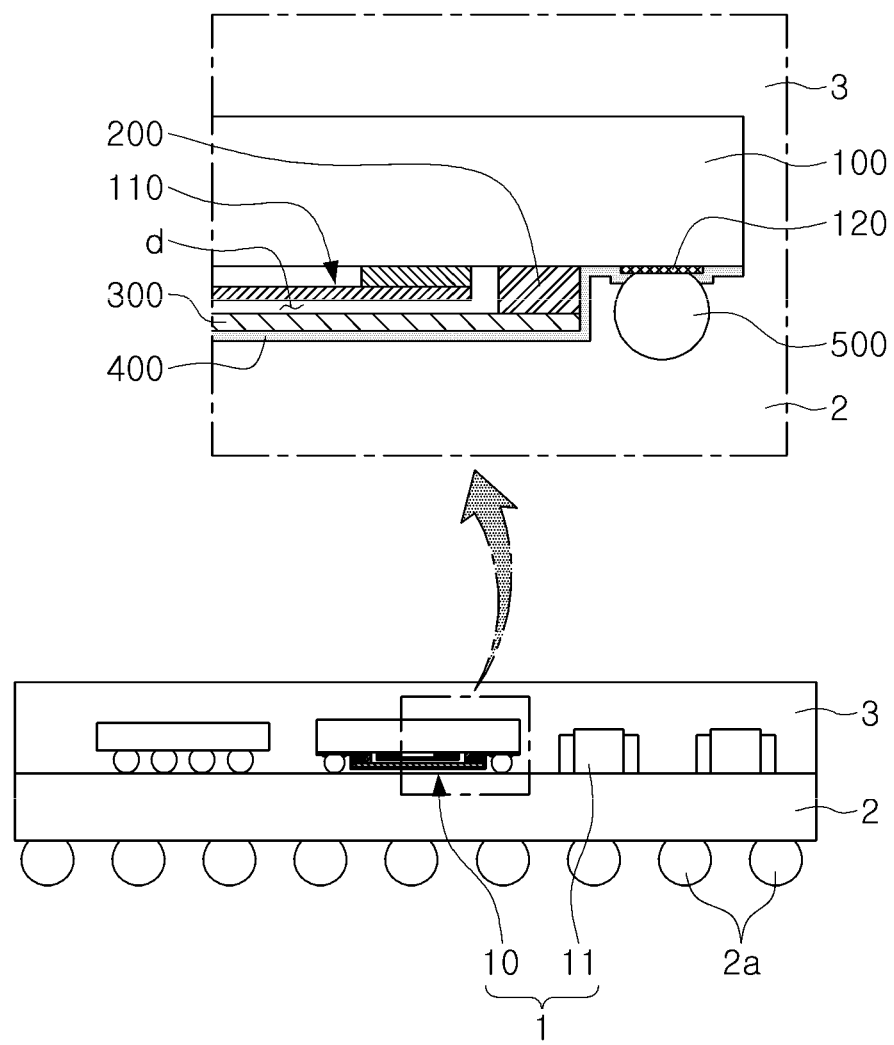
FIG. 9 is a cross-sectional view schematically illustrating an acoustic wave device package according to an embodiment.

FIG. 9 is a cross-sectional view schematically illustrating an acoustic wave device package according to an embodiment.

Referring to FIG. 9, an acoustic wave device package may include a package substrate 2, a plurality of electronic elements 1 mounted on the package substrate 2, and an encapsulating part 3.

As long as the electronic elements 1 are electronic components which may be mounted on the package substrate 2, all of the electronic elements 1 may be used. For example, the electronic elements 1 may be active elements or passive elements.

In addition, the electronic elements according to this embodiment may include one, or a plurality of, acoustic wave devices 10 and other elements 11.

As the package substrate 2, various kinds of substrates (e.g., a ceramic substrate, a printed circuit board, a glass substrate, a flexible substrate, and the like) which are known in the art may be used, and at least one electronic element 1 may be mounted on at least one surface of the package substrate 2. In addition, a plurality of external connection terminals 2a may be disposed on the other surface of the package substrate 2.

The encapsulating part 3 may encapsulate the electronic elements 1 mounted on the package substrate 2. In addition, the encapsulating part 3 may be filled between the electronic elements 1 mounted on the package substrate 2 to prevent an occurrence of an electrical short circuit between the electronic elements 1, and may enclose the outside of the electronic elements 1 and fix the electronic elements 1 to the package substrate 2 to thereby safely protect the electronic elements 1 from external impact.

The encapsulating part 3 may be formed by a method including injection molding. For example, an epoxy mold compound (EMC) may be used as a material of the encapsulating part 3. However, the encapsulating part 3 is not limited thereto. For example, in order to form the encapsulating part 3, various methods such as a method of compressing a resin in a semi-cured state, and the like may be used, as needed.

In addition, the acoustic wave device package may include the acoustic wave device substrate 100 and the package substrate 2 which are disposed to be generally parallel to each other, and the protective member 300 disposed between the two substrates 100 and 2.

In addition, the acoustic wave generator 110 may be disposed between the protective member 300 and the acoustic wave device substrate 100, and the sealing part 400 may be disposed on one surface of the protective member 300 generally facing the package substrate 2.

The acoustic wave device package may be electrically connected to the package substrate 2 through one, or a plurality of, connection terminal(s) 500.

As set forth above, according to embodiments of this description, an acoustic wave device provides hermetic reliability of the space in which an acoustic wave generator is disposed, compared to, for example, when the sealing part is formed of one material. As a result, an element having high reliability is provided.

While exemplary embodiments have been shown and described above, it will be apparent to those skilled in the art that modifications and variations could be made without departing from the scope of the present invention as defined by the appended claims.

What is claimed is:

1. An acoustic wave device comprising:
an acoustic wave generator disposed on a substrate;
a support member disposed on the substrate spaced apart from the acoustic wave generator;
a protective member coupled to the support member and disposed spaced apart from the acoustic wave generator; and
a sealing part encapsulating the protective member and the support member,
wherein the sealing part includes one, or a plurality of, first hermetic layer(s) and one, or a plurality of, second hermetic layer(s),
the first hermetic layer(s) and the second hermetic layer(s) are alternately stacked, and
the first hermetic layer and the second hermetic layer each comprise inorganic films of different materials.

2. The acoustic wave device of claim 1, wherein the first hermetic layer comprises $Al_2O_3$, and
the second hermetic layer comprises $ZrO_2$.

3. An acoustic wave device comprising:
an acoustic wave generator disposed on a substrate;
a support member disposed on the substrate spaced apart from the acoustic wave generator;
a protective member coupled to the support member and disposed spaced apart from the acoustic wave generator; and
an inorganic sealing part encapsulating the protective member and the support member,
wherein the inorganic sealing part comprises one, or a plurality of, first hermetic layer(s), and one, or a plurality of, second hermetic layer(s), and
the first hermetic layer(s) and the second hermetic layer(s) are alternately stacked.

4. The acoustic wave device of claim 3, wherein each of the first hermetic layer(s) and each of the second hermetic layer(s) have a thickness of about 4 nm to about 46 nm.

5. The acoustic wave device of claim 3, wherein each of the first hermetic layer(s) and each of the second hermetic layer(s) have approximately the same thickness.

6. The acoustic wave device of claim 3, wherein the inorganic sealing part has a thickness of about 30 nm to about 50 nm.

7. The acoustic wave device of claim 3, wherein the inorganic sealing part is disposed along a surface formed by the protective member, the support member, and the substrate.

8. The acoustic wave device of claim 3, further comprising a protective layer disposed on a surface of the inorganic sealing part.

9. The acoustic wave device of claim 8, wherein the protective layer comprises an organic film.

10. The acoustic wave device of claim 3, further comprising a metal member disposed on a surface of the protective member,
wherein the surface of the protective member faces toward the acoustic generator.

11. The acoustic wave device of claim 10, wherein a portion of the metal member is disposed between the support member and the protective member.

12. The acoustic wave device of claim 3, wherein the acoustic wave generator comprises a piezoelectric thin film resonator in which a lower electrode, a piezoelectric layer, and an upper electrode are sequentially stacked.

13. The acoustic wave device of claim 3, wherein each of the first hermetic layer(s) comprises an inorganic film of a first material, and
    each of the second hermetic layer(s) comprises an inorganic film of a second material different from the first material.

14. The acoustic wave device of claim 3, wherein each of the first hermetic layer(s) comprises $Al_2O_3$, and
    each of the second hermetic layer(s) comprises $ZrO_2$.

* * * * *